United States Patent
Kim et al.

(10) Patent No.: US 9,425,336 B2
(45) Date of Patent: Aug. 23, 2016

(54) PHOTO ACTIVE LAYER BY SILICON QUANTUM DOT AND THE FABRICATION METHOD THEREOF

(75) Inventors: Kyoung Joong Kim, Daejeon (KR); Seung Hui Hong, Seoul (KR); Jae Hee Park, Suwon-si (KR); Jong Shik Jang, Cheongju-si (KR)

(73) Assignee: Korea Research Institute of Standards and Science, Daejon (KR)

(*) Notice: Subject to any disclaimer, the term of this patent is extended or adjusted under 35 U.S.C. 154(b) by 295 days.

(21) Appl. No.: 14/005,656

(22) PCT Filed: Mar. 22, 2012

(86) PCT No.: PCT/KR2012/002060
§ 371 (c)(1),
(2), (4) Date: Sep. 17, 2013

(87) PCT Pub. No.: WO2012/128564
PCT Pub. Date: Sep. 27, 2012

(65) Prior Publication Data
US 2014/0007930 A1    Jan. 9, 2014

(30) Foreign Application Priority Data
Mar. 22, 2011  (KR) .................. 10-2011-0025425

(51) Int. Cl.
*H01L 31/0352* (2006.01)
*H01L 31/0368* (2006.01)
(Continued)

(52) U.S. Cl.
CPC *H01L 31/035263* (2013.01); *H01L 31/022425* (2013.01); *H01L 31/03682* (2013.01);
(Continued)

(58) Field of Classification Search
CPC .............. H01L 31/035209–31/035263; H01L 31/03682; H01L 31/182; H01L 31/022425; H01L 31/0684; H01L 31/0687; H01L 31/0725; H01L 31/076; H01L 33/04; H01L 33/06; H01L 33/08; H01L 33/0054; H01L 33/34; H01L 49/006; H01L 51/502; H01L 29/15; Y02E 10/546
USPC .................................................. 136/243–265
See application file for complete search history.

(56) References Cited

U.S. PATENT DOCUMENTS 7,750,425 B2    7/2010  Forrest et al.
2004/0106285 A1*  6/2004  Zacharias ............... C23C 14/06
                                                     438/689

(Continued)

FOREIGN PATENT DOCUMENTS

JP    2010509772 A    3/2010
KR    1020100019722 A    2/2010

(Continued)

OTHER PUBLICATIONS

Hao et al. "Phosphorous-doped silicon quantum dots for all-silicon quantum dot tandem solar cells." Solar Energy Materials & Solar Cells 93 (2009) 1524-1530.*

(Continued)

*Primary Examiner* — James Lin
*Assistant Examiner* — Liesl C Baumann
(74) *Attorney, Agent, or Firm* — The Webb Law Firm

(57) ABSTRACT

Provided is a photo active layer for a solar cell or a light emitting diode and a fabricating method thereof. The photo active layer is formed by alternately stacking silicon quantum dot layers in which a plurality of silicon quantum dots containing conductive type impurities are formed in a medium, which is a silicon compound, and conductive layers, which are polycrystalline silicon layers, containing the same conductive type impurities as those of the silicon quantum dots.

6 Claims, 7 Drawing Sheets

(51) Int. Cl.
  *H01L 33/06* (2010.01)
  *H01L 33/08* (2010.01)
  *H01L 33/34* (2010.01)
  *H01L 31/0224* (2006.01)
  *H01L 31/18* (2006.01)
  *H01L 33/00* (2010.01)

(52) U.S. Cl.
  CPC ...... *H01L31/035218* (2013.01); *H01L 31/182* (2013.01); *H01L 33/0054* (2013.01); *H01L 33/06* (2013.01); *H01L 33/08* (2013.01); *H01L 33/34* (2013.01); *Y02E 10/546* (2013.01)

(56) References Cited

U.S. PATENT DOCUMENTS

| | | | | |
|---|---|---|---|---|
| 2004/0234745 A1* | 11/2004 | Chang | ............ | B82Y 10/00 428/323 |
| 2007/0151592 A1* | 7/2007 | Forrest | ............ | B82Y 10/00 136/243 |
| 2008/0251116 A1* | 10/2008 | Green | ............ | B82Y 10/00 136/255 |
| 2010/0240167 A1* | 9/2010 | Dasgupta | ............ | B82Y 20/00 438/63 |
| 2011/0146774 A1 | 6/2011 | Kim et al. | | |
| 2011/0146775 A1 | 6/2011 | Kim et al. | | |
| 2011/0308590 A1* | 12/2011 | Asami | ............ | B82Y 10/00 136/255 |
| 2012/0067416 A1* | 3/2012 | Myong | ............ | H01L 31/03682 136/256 |
| 2012/0119185 A1* | 5/2012 | Iwase | ............ | B82Y 30/00 257/13 |

FOREIGN PATENT DOCUMENTS

| | | |
|---|---|---|
| KR | 1020100027016 A | 3/2010 |
| KR | 1020100067771 A | 6/2010 |

OTHER PUBLICATIONS

Conibeer et al. "Silicon quantum dot nano structures for tandem photovoltaic cells." Thin Solid Films 516 (2008) 6748-6756.*

* cited by examiner

PHOTO ACTIVE LAYER BY SILICON QUANTUM DOT AND THE FABRICATION METHOD THEREOF

CROSS-REFERENCE TO RELATED APPLICATIONS

This application is the United States national phase of International Application No. PCT/KR2012/002060 filed Mar. 22, 2012, and claims priority to Korean Patent Application No. 10-2011-0025425 filed Mar. 22, 2011, the disclosures of which are hereby incorporated in their entirety by reference.

TECHNICAL FIELD

The present invention relates to a photo active layer included in a silicon quantum dot solar cell or a quantum dot light emitting diode and a fabricating method thereof, and more particularly, to a photo active layer having high electrical conductivity to prevent a decrease in photovoltaic efficiency due to resistance and fabricated in a very thick film form, and a fabricating method thereof.

BACKGROUND ART

The solar cell industry is divided into the first generation solar cell, the second generation solar cell, and the third generation solar cell in consideration of a fabricating cost and efficiency of a solar cell. The first generation solar cell, which is a crystalline silicon solar cell that has been developed for decades, currently accounts for 80% or more of all solar cells. The second generation solar cell, which is a solar cell for supplementing a disadvantage of a silicon solar cell having high efficiency but also having a high fabricating cost, means a thin film such as amorphous silicon, a compound, an organic thin film, and the like, and the third generation solar cell, which is a solar cell for obtaining high efficiency at a low cost, means a new solar cell utilizing a nanostructure and a quantum dot.

Since the silicon solar cell, which is the first generation solar cell, has reached the technical limits, research and development for the second generation thin film solar cell has mainly been actively conducted. However, in order to rapidly reach grid parity of a solar cell, development of the low cost and high efficiency third generation solar cell has been demanded.

As one of the promising third generation solar cells, a silicon quantum dot solar cell has been suggested. In this silicon quantum dot solar cell, theoretically, high efficiencies of 29% and 47.5% are expected in the single junction and triple junction solar cells, respectively.

However, the actual efficiency has not approached this theoretical efficiency at all up to now, such that research into finding a cause thereof has been actively conducted.

One of the main reasons that the high efficiency is difficult to be obtained is the low electrical conductivity of the silicon quantum dot layer where the Si quantum dots are enclosed by dielectric medium, such as, $SiO_2$, $Si_3N_4$, and so on. Therefore, the efficiency of the Si quantum dot solar cell is low because of the use of a thin light absorbing layer.

The present applicant has suggested a new structure of a photo active layer that allows electrical conductivity not to be decreased even though a thickness of a light absorbing layer is increased and that may be fabricated in a thick film form, as a result of concentrated research into a quantum dot based solar cell in order to solve the above-mentioned problem.

DISCLOSURE OF INVENTION

Technical Problem

An object of the present invention is to provide a photo active layer having excellent electrical conductivity and a fabricating method thereof, and more particularly, provide a new structure of a silicon quantum dot photo active layer that allows photocurrent to smoothly flow and does not have a limitation in a thickness thereof, and a fabricating method thereof.

Another object of the present invention is to provide a high efficiency solar cell that does not have a limitation in a thickness of a light receiving layer receiving solar light to generate photocurrent and prevents loss of the photocurrent due to resistance.

Still another object of the present invention is to provide a light emitting diode having excellent electrical conductivity to generate light at high efficiency at the time of applying current (or voltage).

Solution to Problem

In one general aspect, a photo active layer is formed by alternately stacking silicon quantum dot layers in which a plurality of silicon quantum dots containing conductive type impurities are formed in a medium, which is a silicon compound, and conductive layers, which are polycrystalline silicon layers, containing the same conductive type impurities as those of the silicon quantum dots.

The silicon quantum dot layer may have a thickness of 70 nm or less. More specifically, the silicon quantum dot layer may have a thickness of 40 nm to 70 nm. The conductive layer may have a thickness of 5 nm to 10 nm.

Each of an uppermost portion and a lowermost layer of the photo active layer may be formed with the silicon quantum dot layer. Therefore, in the solar cell including the photo active layer, the silicon quantum dot layer formed at the lowermost portion of the photo active layer may contact a silicon substrate, and the silicon quantum dot layer formed at the uppermost portion of the photo active layer may contact a front surface electrode of the solar cell.

The medium may be a silicon nitride, a silicon oxide, or a mixture thereof. The medium may contain the same conductive type impurities as the conductive type impurities contained in the silicon quantum dot.

In another general aspect, a fabricating method of a photo active layer includes: a silicon quantum dot layer forming step of forming a silicon quantum dot layer in which silicon quantum dots containing first conductive type impurities are formed in a medium, which is a silicon compound; and a conductive layer forming step of forming a conductive layer, which is a polycrystalline silicon layer, containing the first conductive type impurities on an upper portion of the silicon quantum dot layer, wherein the silicon quantum dot layer forming step and the conductive layer forming step are alternately performed to fabricate the photo active layer on an upper portion of a silicon substrate containing second conductive type impurities, which are impurities complementary to the first conductive type impurities, the photo active layer having alternately stacked silicon quantum dot layers and conductive layers.

The silicon quantum dot layer may have a thickness of 70 nm or less. More specifically, the silicon quantum dot layer may have a thickness of 40 nm to 70 nm.

At the time of alternately performing the silicon quantum dot layer forming step and the conductive layer forming step, a final step of the alternate performance, may be the silicon quantum dot layer forming step so that the silicon quantum dot layer is formed at an uppermost portion of the photo active layer. Therefore, each of an uppermost portion and a lowermost layer of the photo active layer may be formed with the silicon quantum dot layer.

In still another general aspect, a solar cell includes: the photo active layer as described above; a silicon substrate disposed on a lower portion of the photo active layer and containing impurities complementary to conductive type impurities contained in the photo active layer; and an upper electrode formed on an upper portion of the photo active layer and a lower electrode formed on a lower portion of the silicon substrate.

In still another general aspect, a light emitting diode (LED) includes: the photo active layer as described above; a silicon layer disposed on a lower portion of the photo active layer and containing impurities complementary to conductive type impurities contained in the photo active layer; and an upper electrode formed on an upper portion of the photo active layer and a lower electrode formed on a lower portion of the silicon layer containing the complementary impurities.

Advantageous Effects of Invention

As set forth above, the photo active layer according to the exemplary embodiment of the present invention has excellent electrical conductivity to allow photocurrent generated by solar light or current (voltage) applied from the outside to smoothly flow, such that the photo active layer may have high photovoltaic efficiency and does not have a limitation in a thickness thereof.

With the fabricating method of a photo active layer according to the exemplary embodiment of the present invention, it is possible to fabricate a photo active layer that has a limitation in a thickness thereof and prevents charging through simply and easy processes such as deposition and thermal treatment without using a high degree lithography process or epitaxial process.

The solar cell according to the exemplary embodiment of the present invention allows the photocurrent generated by the solar light to smoothly flow, such that the solar cell may have high photovoltaic efficiency, does not have a limitation in a thickness of the photo active layer receiving the solar light to generate a photoelectron-photohole pair, and may absorb a significantly large amount of light by a thick photo active layer.

The light emitting diode according to the exemplary embodiment of the present invention has excellent electrical conductivity to prevent current (external current) consumption due to resistance, such that the light emitting diode may have high photovoltaic efficiency, prevent heat generation due to the resistance, does not have a limitation in a thickness thereof, such that the light emitting diode may emit light in a significant wide area, and may easily design a size of a light emitting area.

BRIEF DESCRIPTION OF DRAWINGS

The above and other objects, features and advantages of the present invention will become apparent from the following description of preferred embodiments given in conjunction with the accompanying drawings, in which.

[Detailed Description of Main Elements]

Figure 1:
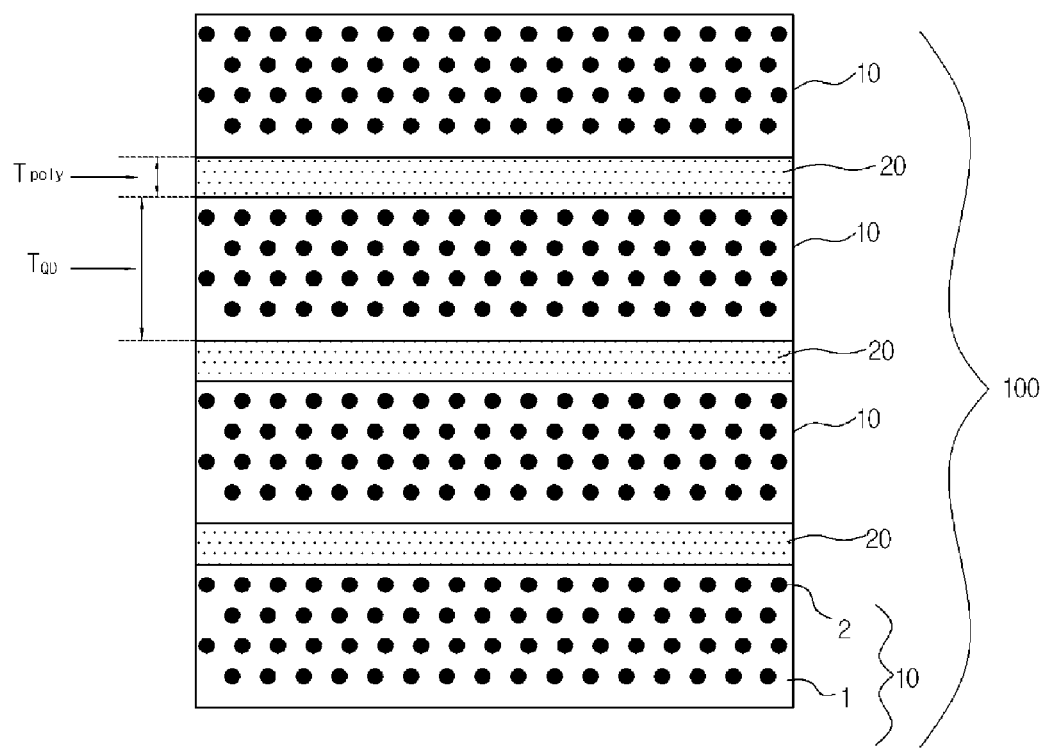
FIG. 1 is a view showing a photo active layer in which the conductive layers and the quantum dot layers are alternately provided.

1: medium 2: silicon quantum dot
10: silicon quantum dot layer 20: conductive layer
100: photo active layer 200: silicon substrate
310, 320: upper electrode 400: lower electrode
11: complex stack layer
12: non-stoichiometric Si compound layer

MODE FOR THE INVENTION

Hereinafter, the embodiments of the present invention will be described in detail with reference to accompanying drawings.

Hereinafter, a photo active layer and a fabricating method thereof according to an exemplary embodiment of the present invention will be described in detail with reference to the accompanying drawings. The drawings to be provided below are provided by way of example so that the idea of the present invention can be sufficiently transferred to those skilled in the art to which the present invention pertains. Therefore, the present invention is not be limited to the drawings provided below but may be modified in many different forms. In addition, the drawings suggested below will be exaggerated in order to clear the spirit and scope of the present invention. In addition, like reference numerals denote like elements throughout the specification.

Technical terms and scientific terms used in the present specification have the general meaning understood by those skilled in the art to which the present invention pertains unless otherwise defined, and a description for the known function and configuration obscuring the present invention will be omitted in the following description and the accompanying drawings.

In describing the present invention, a photo active layer includes a meaning of a light receiving substance generating a photoelectron-photohole pair by receiving light including solar light and a meaning of a light emitting substance in which light is generated in a silicon quantum dot of a photo active layer by applying current or voltage.

FIG. 1 is a view showing a cross section of a photo active layer according to an exemplary embodiment of the present invention. As shown in FIG. 1, the photo active layer 100 according to the exemplary embodiment of the present invention is formed by alternately stacking silicon quantum dot layers 10 in which a plurality of silicon quantum dots 2 containing conductive type impurities are formed in a medium 1, which is a silicon compound, and conductive layers 20, which are polycrystalline silicon layers, containing the same conductive type impurities as those of the medium 1.

The conductive type impurities contained in the silicon quantum dot 2 include p-type impurities generating holes or n-type impurities generating electrons.

It is preferable that the medium is a silicon nitride, a silicon oxide, or a mixture thereof, and is doped with the same conductive type impurities as conductive type impurities contained in the silicon quantum dot 2.

As described above, the conductive type impurities contained in the medium 1, the conductive type impurities contained in the silicon quantum dot 2, and the conductive type impurities contained in the conductive layer 20 are the same conductive type impurities. For example, each of the medium 1, the silicon quantum dot 2, and the conductive layer 20 contain p-type impurities or n-type impurities.

The conductive layer 20 is a polycrystalline silicon film containing the same conductive type impurities as those of the silicon quantum dot layer 10. For example, in the case in which the silicon quantum dot 2 contains the p-type impurities, the conductive layer 20 also contains the p-type impurities, and in the case in which the silicon quantum dot 2 contains the n-type impurities, the conductive layer 20 also contains the n-type impurities. For example, in the Group IV silicon, the p-type impurities may be B, Al, and the like, and the n-type impurities may be P, As, and the like.

As shown in FIG. 1, in the photo active layer 100, the conductive layers 20, which are the polycrystalline silicon layers, containing the same conductive type impurities as the conductive type impurities contained in the silicon quantum dot layer 10 and the silicon quantum dot layer 10 are alternately provided.

Preferably, the photo active layer 100 includes n (n indicates a natural number of 2 or more) silicon quantum dot layers 10 and n−1 (n indicates a natural number of 2 or more) conductive layers 20, wherein the silicon quantum dot layers 10 are positioned at an uppermost portion and a lowermost portion of the photo active layer 100 and the conductive layer 20 is provided between two adjacent silicon quantum dot layers 10 among the n silicon quantum dot layers 10. This is to maximize absorption of solar light or light emitting by the silicon quantum dot by increasing a total thickness of the silicon quantum dot layer 10 while allowing the photo active layer 100 to have high electrical conductivity.

The conductive layer 20 containing the same conductive type impurities as those of the silicon quantum dot layer 10 and including a grain boundary formed by a plurality of silicon grains improves the electrical conductivity of the photo active layer 100 to increase photovoltaic efficiency.

More specifically, even though a photocharge is generated in the silicon quantum dot 2 by receiving the solar light in the silicon quantum dot layer 10, the silicon quantum dot layer 10 including the silicon quantum dot 2 has low electrical conductivity, such that a flow of photocurrent is decreased. Therefore, according to the related art, there was a limitation that efficiency of a solar cell is low due to a limitation that the silicon quantum dot layer 10 may not be thickly formed.

Figure 2:
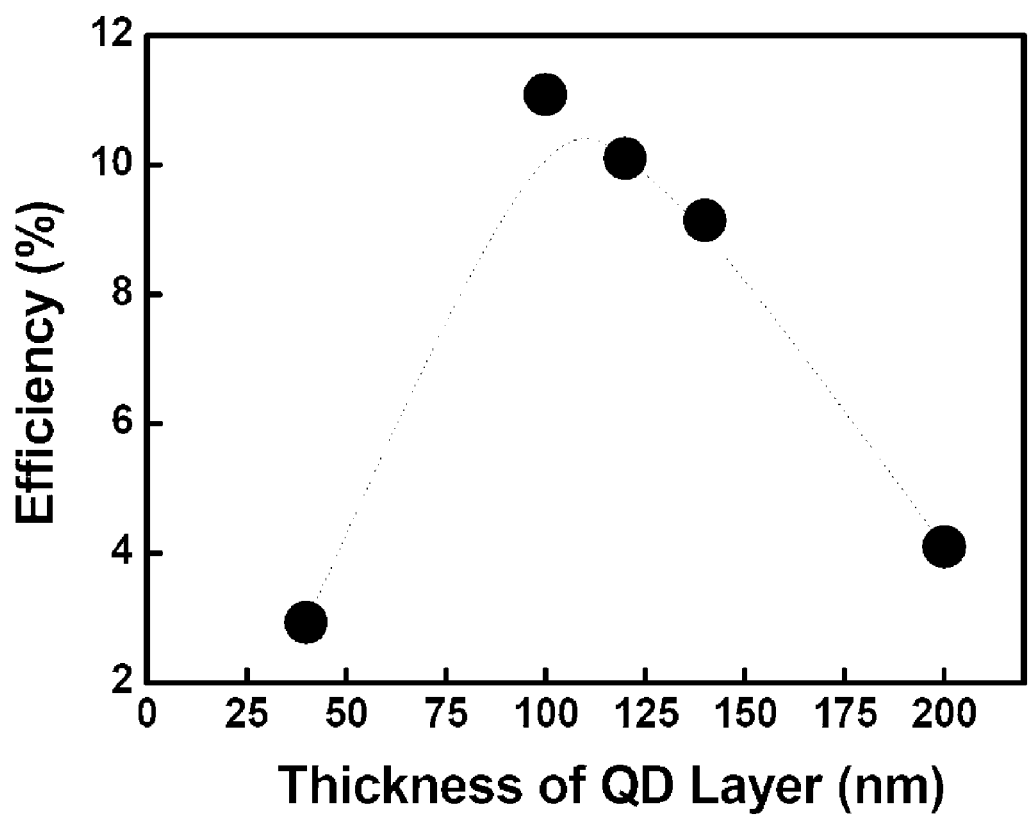
FIG. 2 is a view showing the variation of the photovoltaic efficiency as a function of the thickness of the Si quantum dot layer in a silicon quantum dot solar cell including only a silicon quantum dot layer.

As a substantial example, FIG. 2 is a view showing a measurement result of photovoltaic efficiency according to a thickness of a silicon quantum dot layer (medium: silicon oxide) of a solar cell including only the silicon quantum dot without including the polycrystalline silicon layer. As shown in FIG. 2, it may be appreciated that when a thickness of the silicon quantum dot layer is 100 nm, efficiency is highest, and when the thickness thereof increases, the efficiency decreases.

Figure 3:
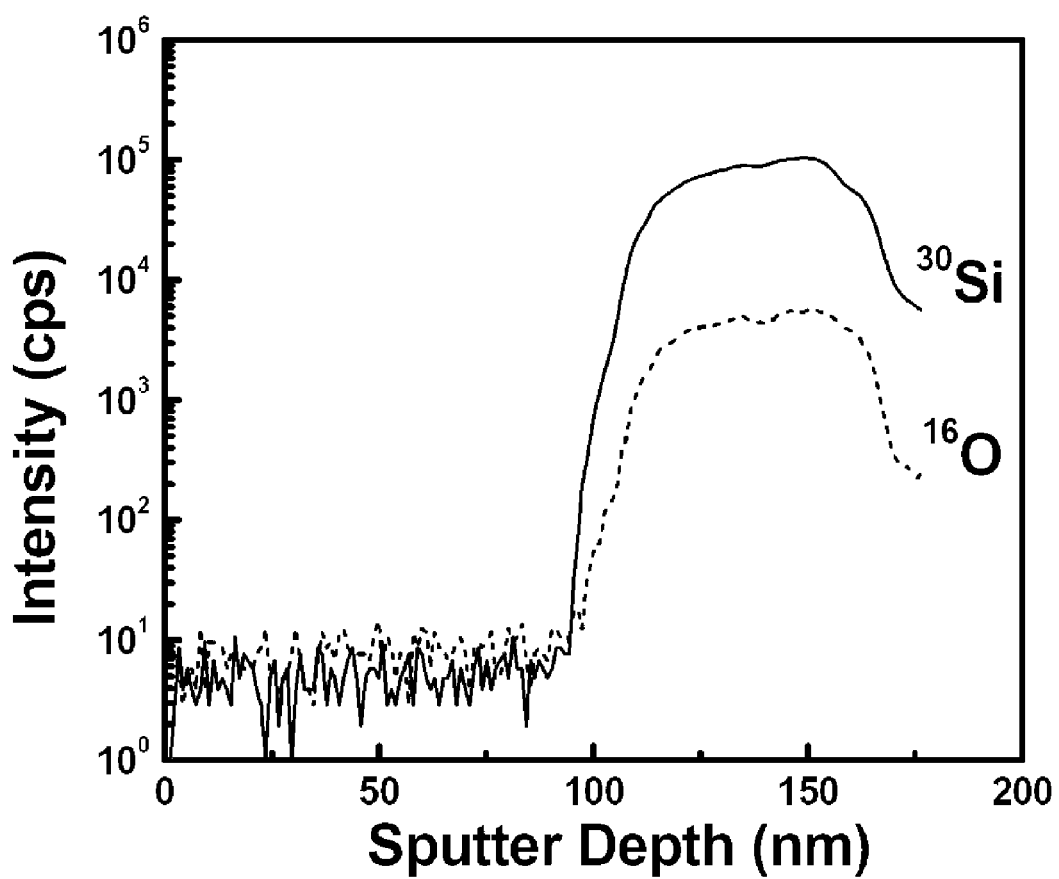
FIG. 3 is a view showing a sputter depth profile of a single silicon quantum dot layer on a Si wafer obtained by secondary ion mass spectrometry.

FIG. 3 is a view showing a sputter depth distribution analyzing result by a secondary ion mass spectrometry of the silicon quantum dot layer (medium: silicon oxide) having a thickness of 200 nm. It may be appreciated that ion intensity is significantly decreased due to charging at an initial stage of the analysis, ion intensity starts to increase when a sputter depth reaches 100 nm (a thickness of the silicon quantum dot layer: 100 nm), and the charging disappears and ion intensity has a stably increased value when a sputter depth reaches 130 nm (a thickness of the silicon quantum dot layer: 70 nm), that is, the electrical conductivity is decreased by the medium in the case in which the silicon quantum dot layer has a thickness of 70 nm or more.

From the result of FIG. 3, it may be appreciated that the decrease in photovoltaic efficiency according to an increase in thickness of FIG. 2 is caused by the decrease in electrical conductivity according to the increase in thickness of the silicon quantum dot layer.

Figure 4:
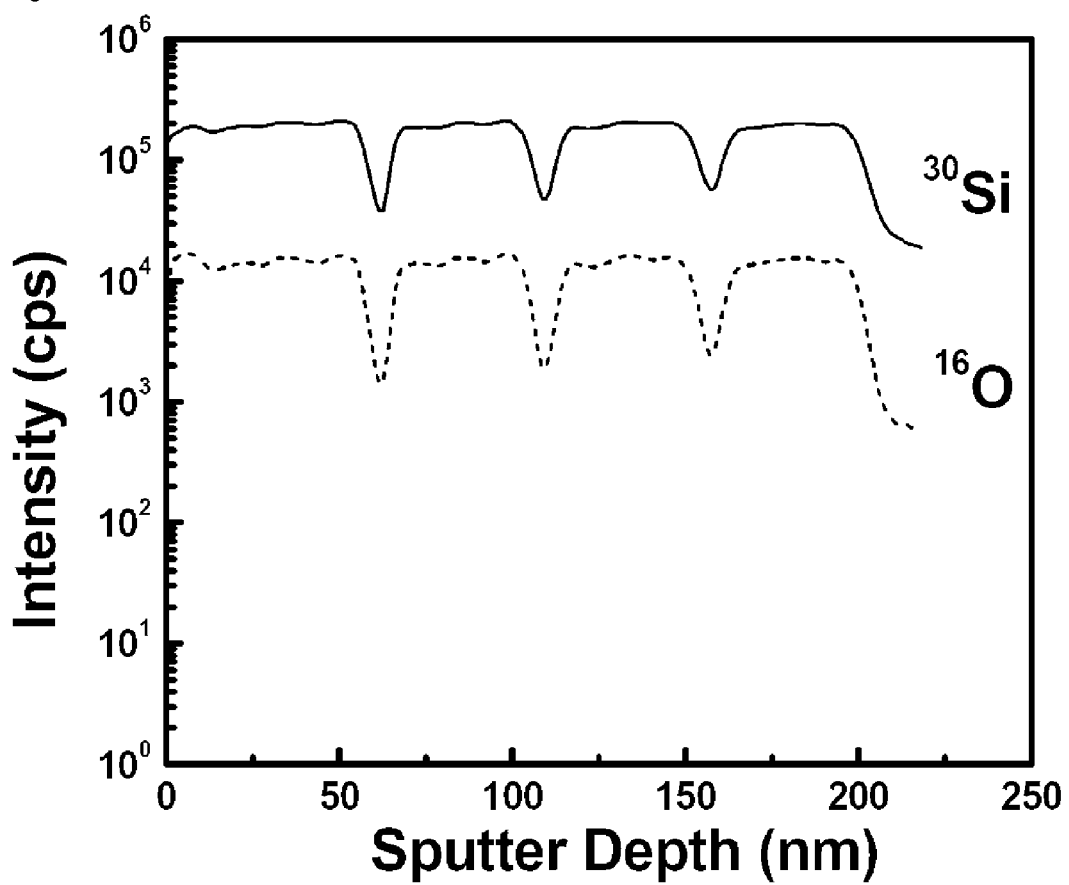
FIG. 4 is a view showing a sputter depth profile of a photo active layer according to the exemplary embodiment of the present invention obtained by secondary ion mass spectrometry.

FIG. 4, which is a structure similar to that of FIG. 1, shows a sputter depth distribution analyzing result by a secondary ion mass spectrometry of a photo active layer having a thickness of 230 nm and formed by alternately stacking polycrystalline silicon layers having a sheet resistance of 1.3 kΩ/square and a thickness of 10 nm and silicon quantum dot layers having a thickness of 50 nm. It may be appreciated from FIG. 4 that even though the photo active layer has a thickness of 230 nm, charging is not formed. In the analyzing result of FIG. 4, ion intensity of oxygen is decreased, such that ion intensity of silicon is also decreased, which is caused by a medium effect and means that a polycrystalline silicon layer is appropriately formed.

Although the results of FIGS. 2 to 4 are shown in view of a flow of photocurrent by reception of the solar light, light emitting in the photo active layer by application of current or voltage has results similar to those of FIGS. 2 to 4.

As seen from the result of FIG. 4, the photo active layer 100 according to the exemplary embodiment of the present invention includes the conductive layer 20, which is the polycrystalline silicon layer containing the conductive type impurities, provided between adjacent silicon quantum dot layers 10, such that a smooth flow of current is induced, and the photo active layer 100 has very excellent electrical conductivity even though a total thickness of the silicon quantum dot layer 10 included in the photo active layer 100 is increased.

According to the exemplary embodiment of the present invention, the photo active layer 100 has a structure in which the silicon quantum dot layers 10 having a thickness of 70 nm or less and the conductive layers 20 are stacked. A thickness tQD of the silicon quantum dot layer 10 is a thickness at which a decrease in electrical conductivity due to the medium is prevented to allow the silicon quantum dot layer 10 itself to have excellent electrical conductivity. Preferably, the silicon quantum dot layer 10 may have a thickness of 40 nm to 70 nm in view of excellent electrical conductivity of the silicon quantum dot layer 10 itself and maximization of solar light receiving capability or maximization of light emitting volume by each silicon quantum dot layer 10.

The photo active layer 100 includes a plurality of silicon quantum dot layers 10 to maximize the solar light receiving capability or the light emitting capability by current. In addition, the photo active layer 100 includes the conductive layer 20 provided between two adjacent silicon quantum dot layers 10 to prevent the decrease in electrical conductivity.

In order to provide a low resistance path between the two adjacent silicon quantum dot layers 10 and minimize a dead zone in which the solar light is not absorbed or light is not emitted, it is preferable that the conductive layer 20 has a thickness of 5 nm to 10 nm. Here, it is preferable that the conductive layer 20 may have a sheet resistance of 1 k$\Omega$/square to 20 k$\Omega$/square by a polycrystalline structure and conductive type impurity doping.

As described above, the conductive layer 20 is provided between the silicon quantum dot layers 10, such that the photo active layer 100 has excellent electrical conductivity regardless of a thickness thereof. A thickness of the photo active layer 100 according to the exemplary embodiment of the present invention is not limited, but is determined in view of maximization of the solar light receiving capability (or light emitting area) and a design of a solar cell (a light emitting diode) according to a utilization field of the photo active layer 100. For example, the photo active layer 100 may have a thickness of 100 nm to 1000 nm.

Figure 5:
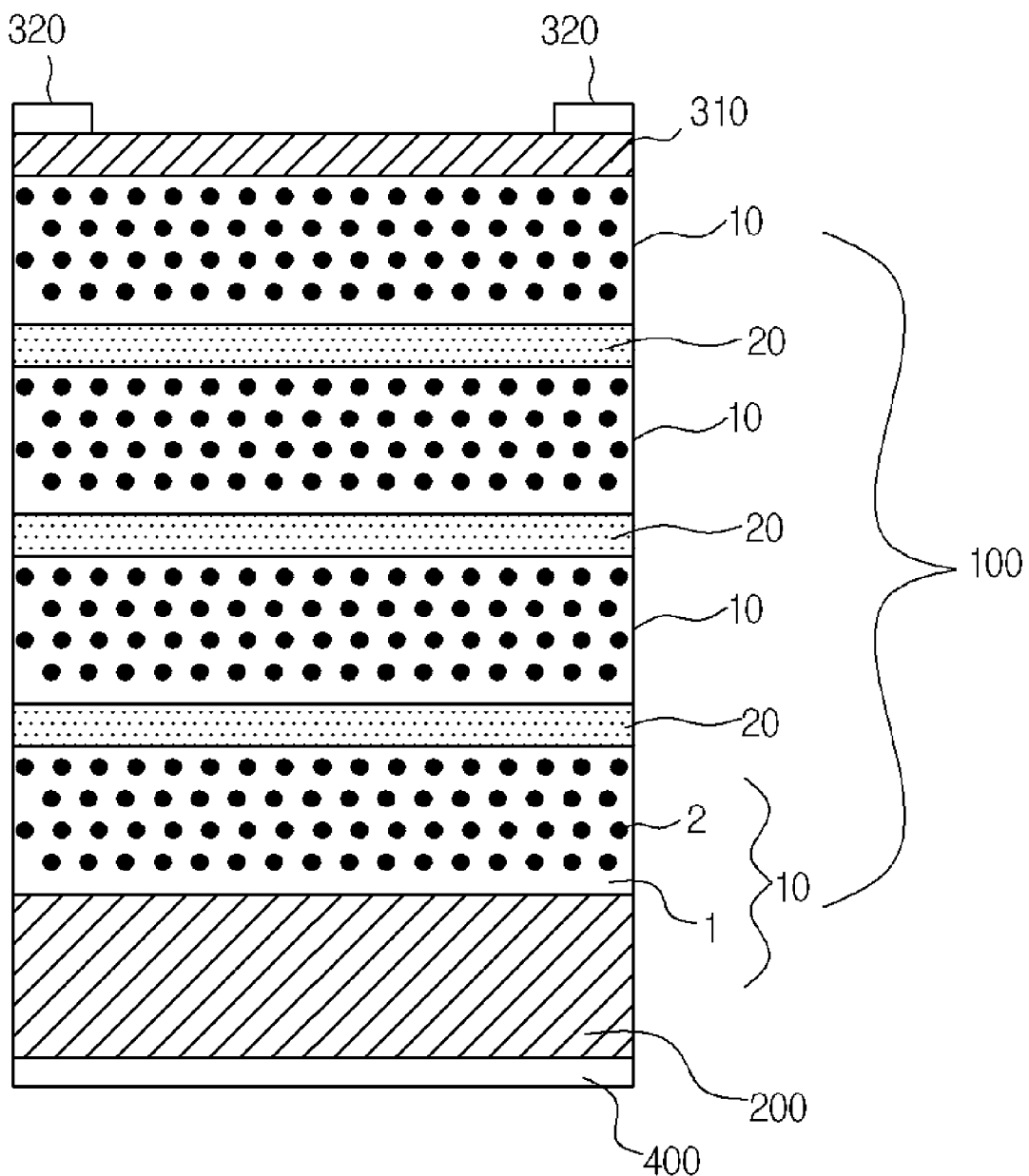
FIG. 5 is a view showing a cross section of a solar cell using a photo active layer according to the exemplary embodiment of the present invention.

FIG. 5 is a view showing a cross section of a solar cell according to the exemplary embodiment of the present invention including the photo active layer 100 described above. As shown in FIG. 5, the solar cell according to the exemplary embodiment of the present invention includes a silicon substrate 200 containing impurities complementary to the conductive impurities contained in the photo active layer 100; the photo active layer 100 disposed on an upper portion of the silicon substrate 200; an upper electrode 310 and 320 disposed on an upper portion of the photo active layer 100; and a lower electrode 400 disposed on a lower portion of the silicon substrate 200.

The meaning of the impurities complementary to the conductive impurities contained in the photo active layer includes the different type of doping elements from the conductive type impurities contained in the photo active layer. For example, if the conductive type impurities in the photo active layer are p-type impurities, then the complementary impurities can be n-type impurities, and vice versa.

In the case in which the conductive type impurities contained the silicon quantum dot 2 and the conductive layer 20 of the photo active layer 100 are p-type impurities, the silicon substrate 200 is a substrate doped with n-type impurities, and in the case in which the conductive type impurities contained the silicon quantum dot 2 and the conductive layer 20 of the photo active layer 100 are n-type impurities, the silicon substrate 200 is a substrate doped with p-type impurities.

It is preferable that the upper electrode 310 and 320 has a structure of a transparent electrode film 310 and a metal pad 320 disposed on an upper portion of the transparent electrode film 310, wherein the transparent electrode film 310 may be formed over the entire surface of the photo active layer 100.

Here, the upper and lower electrodes are fabricated by a general printing method such as a screen printing method, a stencil printing method, or the like, using a conductive metal paste or deposition using PVD/CVD.

Figure 6:
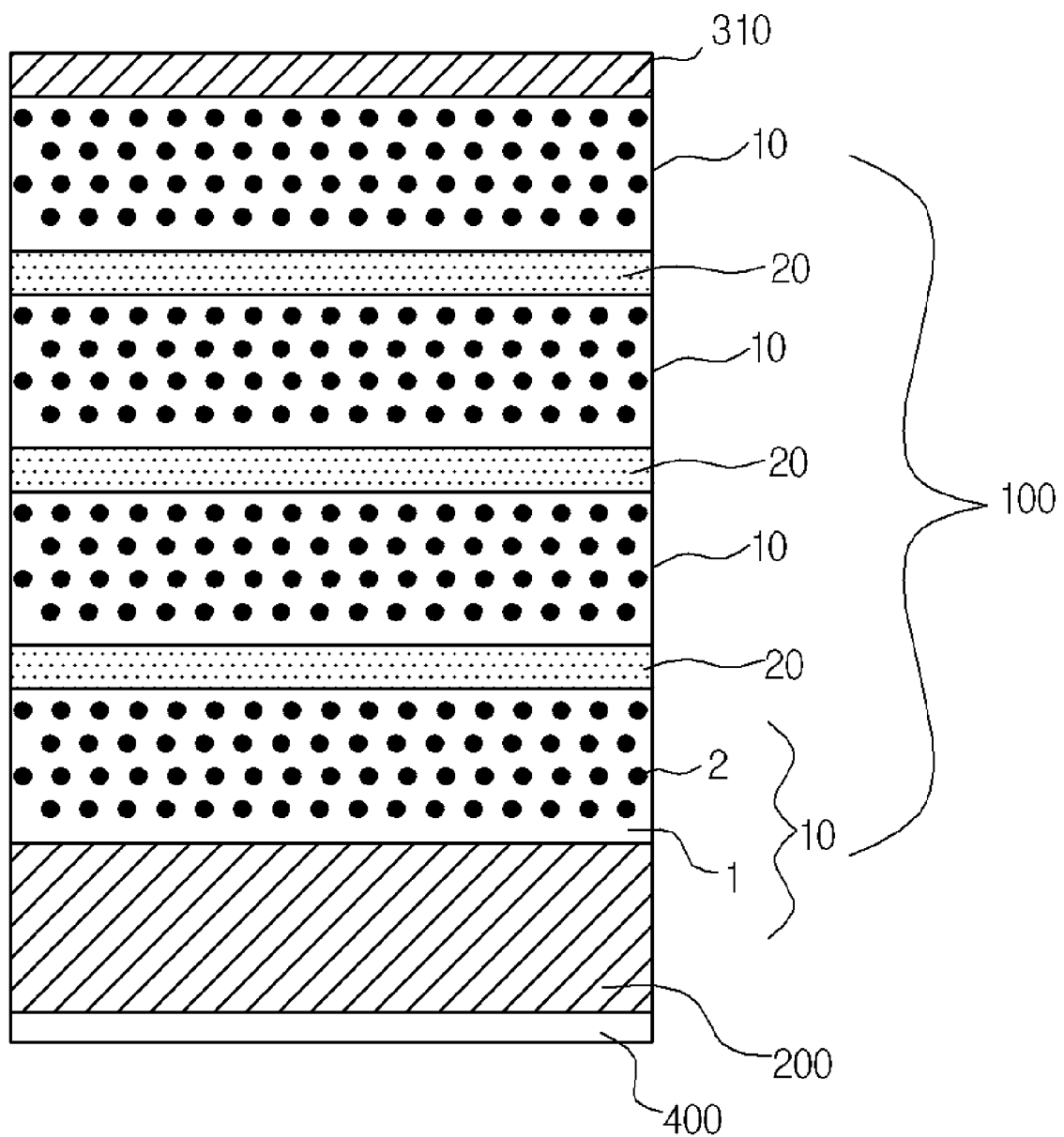
FIG. 6 is a view showing a cross section of a light emitting diode using a photo active layer according to the exemplary embodiment of the present invention.

FIG. 6 is a view showing a cross section of a light emitting diode according to the exemplary embodiment of the present invention. The light emitting diode shown in FIG. 6 has a structure similar to that of FIG. 5 except for an upper electrode. More specifically, the light emitting diode according to the exemplary embodiment of the present invention includes the photo active layer 100 described above, a silicon layer 200 disposed on a lower portion of the photo active layer 100 and containing impurities complementary to the conductive impurities contained in the photo active layer 100, an upper electrode 310 formed on an upper portion of the photo active layer 100, and a lower electrode 400 formed on a lower portion of the silicon layer containing the complementary impurities. The upper electrode 310 and the lower electrode 400 of FIG. 6 may be formed by depositing or printing a conductive metal material generally used in an electrical device. An example of the conductive metal material may include gold, silver, aluminum, copper, and the like.

Hereinafter, a fabricating method of a photo active layer according to an exemplary embodiment will be described. The fabricating method of a photo active layer 100 according to the exemplary embodiment of the present invention includes a silicon quantum dot layer forming step of forming a silicon quantum dot layer in which silicon quantum dots containing first conductive type impurities are formed in a medium, which is a silicon compound; and a conductive layer forming step of forming a conductive layer, which is a polycrystalline silicon layer, containing the first conductive type impurities on an upper portion of the silicon quantum dot layer, wherein the silicon quantum dot layer forming step and the conductive layer forming step are alternately performed to fabricate the photo active layer on an upper portion of a silicon substrate containing second conductive type impurities, which are impurities complementary to the first conductive type impurities, the photo active layer having alternately stacked silicon quantum dot layers and conductive layers.

Figure 7:
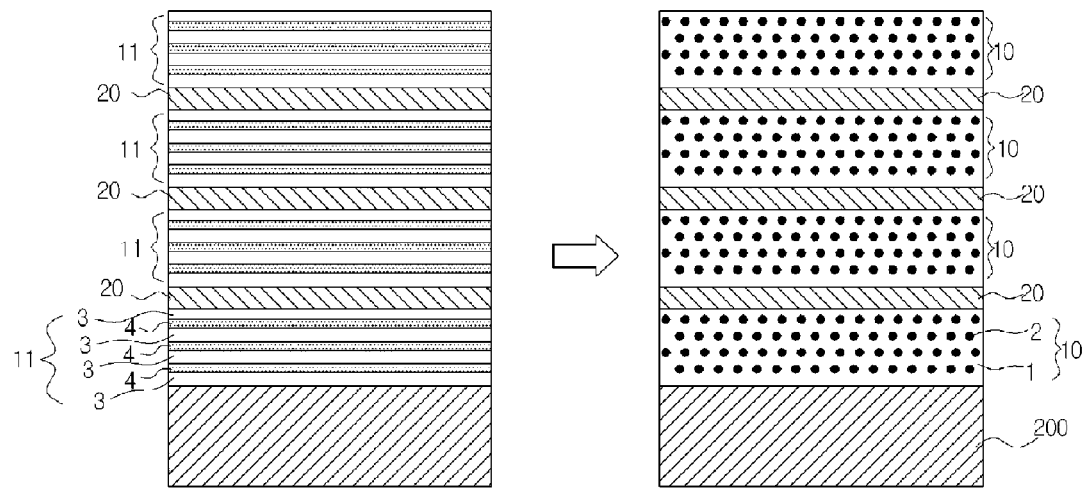
FIG. 7 is a view showing a fabricating method of a photo active layer using a step forming the Si quantum dot layers from complex stack layers which are the multilayers by non-stoichiometric Si compound and stoichiometric Si compound layers.

FIG. 7 is a process view showing a fabricating method of a photo active layer according to the exemplary embodiment of the present invention. As shown in FIG. 7, medium layers 3 doped with first conductive type impurities and being a silicon nitride, a silicon oxide, or a mixture thereof and silicon layers 4 for forming quantum dots are alternately deposited on an upper portion of a silicon substrate 200 containing second conductive type impurities to form a complex stack layer 11 having a multi-layer thin film structure, and a polycrystalline silicon layer doped with the first conductive type impurities, which are the same conductive type impurities as those of the medium layer 3, is deposited on an upper portion of the complex stack layer 11 to form a conductive layer 20.

It is preferable that the silicon layer 4 for forming quantum dots is a thin layer formed of a polycrystalline silicon; or a silicon oxide, a silicon nitride, or a mixture thereof having a non-stoichiometric ratio in which oxygen or nitrogen is deficient. Here, the silicon layer 4 for forming quantum dots may also be doped with the first conductive type impurities, similar to the medium layer 3.

Each of the complex stack layer 11 and the conductive layer 20 may be formed by chemical deposition, physical deposition, physical-chemical deposition, plasma deposition, atomic layer deposition, or vacuum thermal evaporation.

Then, a complex stack layer 11 forming step by repeated stacking of the medium layers 3 and the silicon layers 4 for forming quantum dots and a conductive layer forming step of forming the conductive layer 20, which is the polycrystalline silicon layer doped with the first conductive type impurities, which are the same conductive type impurities as those of the medium layer 3, on an upper portion of the complex stack layer 11 are alternately performed repeatedly.

Preferably, at the time of repeatedly performing the complex stack layer 11 forming step and the conductive layer 20 forming step, the complex stack layer 11 forming step is finally performed, such that the silicon quantum dot layer 10 is formed at an uppermost portion of the photo active layer.

At the time of deposition for forming the complex stack layer 11, it is preferable to deposit the medium layer 3 and the silicon layer 4 for forming quantum dots so that each of the medium layer 3 and the silicon layer 4 for forming quantum dots has a thickness in nanometer order, and it is more preferable to deposit the medium layer 3 and the silicon layer 4 for forming quantum dots so that each of the medium layer 3 and the silicon layer 4 for forming quantum dots has a mutually independent thickness of 1 to 5 nm in order to uniformly and effectively form silicon quantum dots enclosed by a medium.

It is preferable that the complex stack layer 11 has a thickness of 40 nm to 70 nm in view of excellent electrical conductivity of the silicon quantum dot layer 10 itself and maximization of solar light receiving capability or maximization of a light emitting area by each silicon quantum dot layer 10.

In order to stably maintain a film shape with respect to the thermal treatment, provide a low resistance path between two adjacent silicon quantum dot layers 10, and minimize a dead zone in which the solar light is not absorbed or light is not emitted, it is preferable that the conductive layer 20 is deposited at a thickness of 5 nm to 10 nm.

After a multilayer film in which the complex stack layer 11 and the conductive layer 20 are stacked is formed, the multilayer film is subjected to thermal treatment and hydrogenation treatment, such that the photo active layer 100 according to the exemplary embodiment of the present invention is fabricated.

A plurality of silicon quantum dots 2 doped with the first conductive type impurities are formed in the medium 1 through the thermal treatment of the complex stack layer 11, such that the complex stack layer 11 is fabricated as a silicon quantum dot layer 10. More specifically, through the thermal treatment, the silicon layer 4 for forming quantum dots of the complex stack layer 11 is changed into an array shape of silicon quantum dots 2 enclosed by a medium material configuring the medium layer 3 using stress relaxation and minimization of interface energy as driving force, such that the silicon quantum dot layer 10 is fabricated. After the silicon quantum dot layer 10 is formed through the thermal treatment, the silicon quantum dot layer is again thermally treated under hydrogen atmosphere to bond unpaired electrons of the silicon quantum dot 2 to hydrogen.

The thermal treatment needs to be determined according to a kind of medium, a kind of semiconductor thin film, a size and density of a quantum dot to be fabricated. At the time of fabricating the semiconductor quantum dot, in the case in which a temperature of the thermal treatment is excessively low, material movement is difficult, such that it is difficult to obtain a semiconductor quantum dot shape, and in the case in which a temperature of the thermal treatment is excessively high, there are risks that a size of the semiconductor quantum dot will become significantly non-uniform and that a granulated particle having a weak quantum confinement effect will be generated.

It is preferable that the thermal treatment for forming the silicon quantum dot 2 is performed at a temperature of 1000 to 1200° C. in the case in which the medium is a silicon oxide, preferably, $SiO_2$ and performed at a temperature of 800 to 1200° C. in the case in which the medium is a silicon nitride, preferably, $Si_3N_4$. In addition, it is preferable that the thermal treatment is performed for 10 to 30 minutes.

Then, a hydrogenation step of performing the thermal treatment under hydrogen atmosphere to bond unpaired electrons of the silicon quantum dot to hydrogen is conducted. A thermal treatment temperature of the hydrogenation step needs to be determined according to a kind of quantum dot. It is preferable that the thermal treatment is performed at a temperature of 600 to 700° C. for 30 to 90 minutes under hydrogen atmosphere using forming gas (forming gas; 95% Ar-5% $H_2$) in the case in which the semiconductor quantum dot is the silicon quantum dot. See Korean Patent Laid-Open Publication No. 2010-0027016 or 2010-0019722 by the present applicant with respect to a detailed content of a fabricating method of a silicon quantum layer using a complex stack layer or a non-stoichiometric silicon compound layer to be described below.

Figure 8:
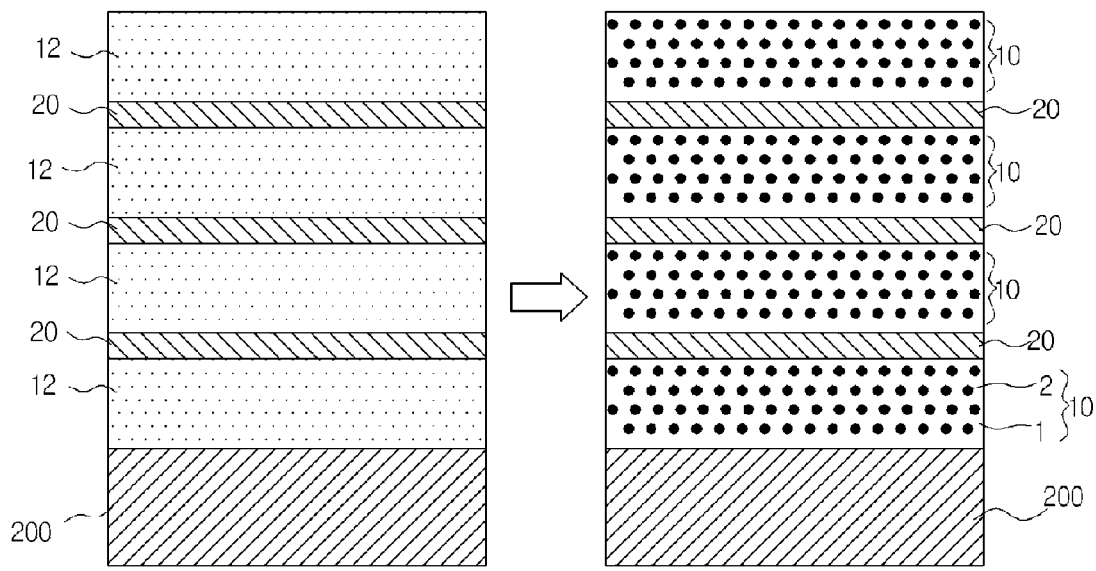
FIG. 8 is a view showing a fabricating method of a photo active layer using a step forming the Si quantum dot layers from non-stoichiometric Si compound layers.

FIG. 8 is a view showing a fabricating method of a photo active layer according to another exemplary embodiment of the present invention. As shown in FIG. 8, a non-stoichiometric Si compound layer 12 doped with first conductive type impurities and containing a silicon oxide, a silicon nitride, or a mixture thereof having a non-stoichiometric ratio in which oxygen or nitrogen is deficient is deposited on an upper portion of a silicon substrate 200 containing second conductive type impurities, and a polycrystalline silicon layer doped with the first conductive type impurities is deposited on an upper portion of the non-stoichiometric Si compound layer 12 to form a conductive layer 20.

Then, a non-stoichiometric Si compound layer forming step of forming the non-stoichiometric Si compound layer 12 doped with the first conductive type impurities and containing the silicon oxide, the silicon nitride, or the mixture thereof having the non-stoichiometric ratio in which the oxygen or the nitrogen is deficient and a conductive layer forming step of forming the second conductive layer 20, which is the polycrystalline silicon layer doped with the first conductive type impurities are alternately performed repeatedly Preferably, at the time of repeatedly performing the non-stoichiometric Si compound layer 12 forming step and the conductive layer 20 forming step, the non-stoichiometric Si compound layer 12 forming step is finally performed, such that the silicon quantum dot layer 10 is formed at an uppermost portion of the photo active layer.

It is preferable that the non-stoichiometric Si compound layer 12 has a thickness of 40 nm to 70 nm in view of excellent electrical conductivity of the silicon quantum dot layer 10 itself and maximization of solar light receiving capability or maximization of light emitting capability by each silicon quantum dot layer 10.

In order to stably maintain a film shape with respect to the thermal treatment, provide a low resistance path between two adjacent silicon quantum dot layers 10, and minimize a dead zone in which the solar light is not absorbed or light is not emitted, it is preferable that the conductive layer 20 is deposited at a thickness of 5 nm to 10 nm.

The conductive layer 20 may be formed by chemical deposition, physical deposition, physical-chemical deposition, plasma deposition, atomic layer deposition, or vacuum thermal evaporation.

The non-stoichiometric Si compound layer 12 is formed by a deposition process including a physical vapor deposition process, a chemical vapor deposition process, or an atomic layer deposition process. At the time of the deposition process, a ratio between a precursor (for example, a silicon precursor) of a semiconductor material and oxygen or nitrogen is controlled, thereby making it possible to control a degree that the oxygen or the nitrogen is out of a stoichiometric ratio.

The non-stoichiometric Si compound layer 12 includes a silicon oxide or a silicon nitride in which oxygen or nitrogen is deficient in 50% (atomic % based on a stoichiometric ratio)

from an oxygen or nitrogen amount required for bonding based on a stoichiometric ratio, and includes a gradient of an oxygen or nitrogen amount formed in a thickness direction.

For example, in the case in which a semiconductor material is silicon, a silicon oxide in which oxygen is deficient in 50% (atomic %) from an oxygen amount required for bonding based on a stoichiometric ratio has a composition of $SiO_2$ (stoichiometric ratio) to SiO (50% deficiency), and a silicon nitride in which nitrogen is deficient in 50% (atomic %) from a nitrogen amount required for bonding based on a stoichiometric ratio has a composition of $Si_3N_4$ (stoichiometric ratio) to $Si_3N_2$ (50% deficiency).

At the time of thermal treatment for forming the silicon quantum dot layer, in the non-stoichiometric Si compound layer 12, the silicon quantum dots doped with the first conductive type impurities are formed in the medium, which is a silicon oxide, a silicon nitride, or a mixture thereof, using a composition that is out of a stoichiometric ratio as driving force.

After a multilayer film in which the non-stoichiometric Si compound layers 12 and the conductive layers 20 are alternately stacked is formed, the multilayer film is subjected to thermal treatment and hydro-treatment as described above with reference to FIG. 7, such that the photo active layer 100 according to the exemplary embodiment of the present invention is fabricated.

Hereinabove, although the present invention has been described by specific matters, exemplary embodiments, and drawings, they have been provided only for assisting in the entire understanding of the present invention. Therefore, the present invention is not limited to the exemplary embodiments. Various modifications and changes may be made by those skilled in the art to which the present invention pertains from this description.

Therefore, the sprit of the present invention should not be limited to the above-described exemplary embodiments, and the following claims as well as all modified equally or equivalently to the claims are intended to fall within the scopes and spirits of the invention.

The invention claimed is:

1. A photo active layer comprising a silicon quantum dot layer and a conductive polycrystalline silicon layer, alternately stacked, the silicon quantum dot layer formed with a plurality of actively doped silicon quantum dots containing first conductive type impurities in a medium of silicon compound, and the conductive polycrystalline silicon layer doped by the first conductive type impurities which are the same conductive type impurities as those of the silicon quantum dots, wherein the silicon quantum dot layer is positioned on each of an uppermost portion and a lowermost portion of the photo active layer.

2. The photo active layer of claim 1, wherein the silicon quantum dot layer has a thickness of 70 nm or less.

3. The photo active layer of claim 1, wherein the conductive polycrystalline silicon layer has a thickness of 5 nm to 10 nm.

4. The photo active layer of claim 1, wherein the medium is a silicon nitride, a silicon oxide, or a mixture thereof.

5. A solar cell comprising:

the photo active layer of claim 1;

a silicon substrate disposed on the lowermost portion of the photo active layer and containing a different type of doping elements from the first conductive type impurities contained in the photo active layer; and an upper electrode formed on the uppermost portion of the photo active layer and a lower electrode formed on a lower portion of the silicon substrate.

6. A light emitting diode (LED) comprising:

the photo active layer of claim 1;

a silicon layer disposed on the lowermost portion of the photo active layer and containing a different type of doping elements from the first conductive type impurities contained in the photo active layer; and an upper electrode formed on the uppermost portion of the photo active layer and a lower electrode formed on a lower portion of the silicon layer containing the different type of doping elements.

* * * * *